US012316393B2

(12) United States Patent
Bobrek et al.

(10) Patent No.: US 12,316,393 B2
(45) Date of Patent: May 27, 2025

(54) DIGITAL FREQUENCY DIFFERENCE ESTIMATOR FOR SIGNALS RECEIVED FROM DIFFERENT ANTENNAS

(71) Applicant: Fairwinds Technologies, LLC, Annapolis, MD (US)

(72) Inventors: Pavlo Bobrek, Bradenton, FL (US); Keith Adams, Lake Ronkonkoma, NY (US); Glenn Link, Odenton, MD (US); Timothy Hillner, Middletown, DE (US)

(73) Assignee: Fairwinds Technologies, LLC, Annapolis, MD (US)

( * ) Notice: Subject to any disclaimer, the term of this patent is extended or adjusted under 35 U.S.C. 154(b) by 188 days.

(21) Appl. No.: 18/322,248

(22) Filed: May 23, 2023

(65) Prior Publication Data

US 2024/0396643 A1    Nov. 28, 2024

(51) Int. Cl.
*H04B 17/20*    (2015.01)
*H04B 1/16*    (2006.01)

(52) U.S. Cl.
CPC ............ *H04B 17/201* (2023.05); *H04B 1/16* (2013.01)

(58) Field of Classification Search
CPC .. H04B 10/6161; H04B 10/63; H04B 10/614; H04B 1/7117; H04B 1/30; H04B 1/7095; H04B 10/61; H04B 1/006; H04B 1/403; H04B 1/406; H04B 1/70754; H04B 10/6162; H04B 10/6164; H04B 10/6165; H04B 2201/70701; H04B 1/7073; H04B 1/708; H04B 10/532; H04B 10/60; H04B 10/64; H04B 10/11

USPC ......................................................... 455/67.16
See application file for complete search history.

(56) References Cited

U.S. PATENT DOCUMENTS

| | | | |
|---|---|---|---|
| 2005/0109123 A1* | 5/2005 | Cheesewright | G01F 15/024 73/861.355 |
| 2005/0184822 A1* | 8/2005 | Mattila | H03H 9/02244 331/175 |
| 2016/0315646 A1* | 10/2016 | van de Beek | H04L 27/06 |

FOREIGN PATENT DOCUMENTS

| | | |
|---|---|---|
| CN | 107247181 A | 11/1992 |
| CN | 112910533 B | 9/2022 |
| JP | H04316213 A | 10/2017 |

* cited by examiner

*Primary Examiner* — Ajibola A Akinyemi
(74) *Attorney, Agent, or Firm* — Laubscher & Fretwell, P.C.

(57) ABSTRACT

A device and method for estimating the frequency difference between antennas having asynchronized local oscillator references includes a frequency meter configured for connection with radio frequency signals from two antennas and configured to output a measured frequency difference between baseband filtered signals of two antennas. The frequency meter includes a phase meter, a quadrant transition, and a frequency meter counter. The phase meter receives in-phase and quadrature pairs of filtered signals and output a phase difference between the pairs. The quadrant transition state machine receives the phase difference, detects a quadrant associated with the phase difference, and detects a change between the detected quadrant and a previously detected quadrant. The frequency meter counter then accumulates the quadrant transitions and direction over a desired interval to establish a measure of the frequency difference between the two radio frequency signals input into phase meter.

13 Claims, 5 Drawing Sheets

DIGITAL FREQUENCY DIFFERENCE ESTIMATOR FOR SIGNALS RECEIVED FROM DIFFERENT ANTENNAS

BACKGROUND

The present disclosure relates generally to a signal processing device and method, and more specifically to a device and method for measuring the frequency offset between a radio frequency signal from separate antennas.

The signal to noise ratio of a signal received from a satellite is improved if the output of multiple antennas can be coherently combined. Each antenna down-converts a satellite frequency band to an intermediate frequency band, for example to L-Band (950 MHz to 1950 MHZ). An example of an adaptive phase aligner that enables coherent combining is disclosed in U.S. patent application Ser. No. 17/577,308, the entire content of which is incorporated herein by reference.

For instances where antennas cannot use a common local oscillator (LO) frequency reference, there will be a frequency offset between the signals received from the antennas which must be minimized to enable coherent combining, e.g., using the adaptive phase aligner of the '308 application. There is thus a need for a device and method that measures frequency offsets for antennas that cannot use a common local oscillator reference to better align a signal from two antennas to enable coherent combining.

SUMMARY

Accordingly, it is an object of the present disclosure to provide a device for estimating the frequency difference between antennas having asynchronized local oscillator references. The device includes a frequency meter configured for connection with radio frequency signals from two antennas and configured to output a measured frequency difference between baseband filtered signals of two antennas. The frequency meter includes a phase meter, a quadrant transition, and a frequency meter counter. The phase meter receives in-phase and quadrature pairs of filtered signals and outputs a phase difference between the pairs. The quadrant transition state machine receives the phase difference, detects a quadrant associated with the phase difference, and detects a change between the detected quadrant and a previously detected quadrant. The frequency meter counter then accumulates the quadrant transitions and direction over a desired interval to establish a measure of the frequency difference between the two radio frequency signals input into phase meter.

In one embodiment, the quadrant transition state machine includes a quadrant detector, a plurality of quadrant counters, a quadrant transition detector, and a quadrant transition counter. The quadrant detector is configured to detect a quadrant of the phase difference between two in-phase and quadrature pairs and increment a counter associated with the detected quadrant. The plurality of quadrant counters receive a signal from the quadrant detector to increment a quadrant count, wherein a quadrant counter is incremented when the phase difference lies within a quadrant associated with the quadrant counter. The quadrant transition detector is configured to detect one of a changed state and maintained state between a current quadrant state and a previous quadrant state. The quadrant transition counter is incremented when a detected quadrant change is clockwise, decremented when a detected quadrant change is counterclockwise, and maintained when there is no quadrant change detected.

In another embodiment, the quadrant transition state machine further includes a confidence threshold detector which detects when one of the quadrant counters exceeds a confidence threshold. When the threshold is exceeded, the quadrant associated with that counter becomes the current quadrant state. The state machine also includes a quadrant select which is configured to set a new quadrant state when the confidence threshold is exceeded. A register stores a previous quadrant state and an interval timer periodically records the output of quadrant transition counter and resets the quadrant transition counter such that the recorded output of the quadrant transition counter is proportional to frequency.

In yet another embodiment, the device further includes analog to digital converters, digital down converters, and decimation filters. These elements digitize a frequency band, translate a digitized frequency band to a baseband to create in-phase and quadrature pairs, and filter a translated-to-baseband frequency band and output the filtered frequency band to the frequency meter, respectively.

In a further embodiment, the device includes radio frequency front ends configured to receive a radio frequency signal and filter the signal to an intermediate frequency band which is output to the analog to digital converters. There is preferably also a low pass filter having an adapt rate parameter to control a phase adaptation rate.

It is further an object of the present disclosure to provide a method for estimating the reference frequency difference between antennas having asynchronized local oscillator references. The method includes determining the quadrant of the phase difference between in-phase and quadrature pairs of a plurality of radio frequency signal samples from at least two antennas, determining whether a quadrant state has changed between adjacent samples, and measuring the frequency difference between the signal samples. A state change results from adjacent samples having one of a clockwise and counterclockwise change in quadrant. Measuring the frequency difference relates to accumulating the number of quadrants traversed and the net direction of rotation that results over a sampling period.

In one embodiment of the method, measuring the frequency difference between two signals includes incrementing, decrementing or maintaining a state change counter. The state change counter is incremented when adjacent samples result in a clockwise change in quadrants, the state change counter is decremented when adjacent samples result in a counterclockwise change in quadrants, and the state change counter is maintained when adjacent samples have the same quadrant.

In another embodiment, the method further includes accumulating the number of clock intervals for each quadrant to which a phase difference matches and establishing a current quadrant state when the accumulated number of clock intervals for a quadrant exceeds a confidence interval.

Preferably, the method also includes adjusting the signal frequencies of the signal from at least two antennas to account for measured frequency offset.

BRIEF DESCRIPTION OF THE DRAWINGS

Other objects and advantages of the disclosure will become apparent from a study of the following specification when viewed in the light of the accompanying drawing, in which.

DETAILED DESCRIPTION

Figure 1:
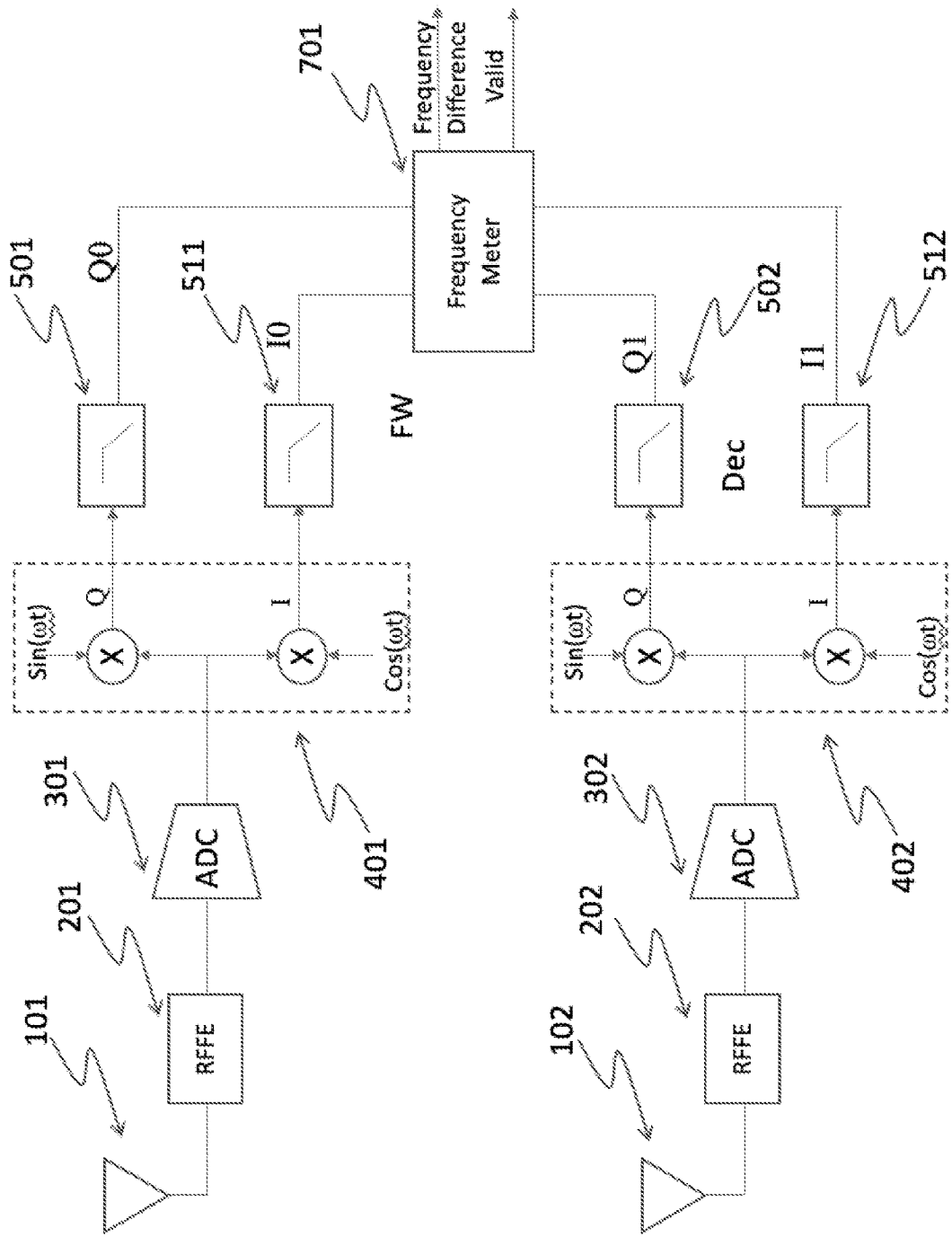
FIG. 1 is a schematic representation of one embodiment of the present disclosure depicting separate signal paths for two antennas whose frequency separation is to be measured.

The present disclosure relates to a device and method for measuring the frequency offset of a signal received from different antennas having asynchronous local oscillator frequency references. Using pairwise cancellation of frequency offset, multiple antennas can be frequency matched. Described herein is a device and its architecture, along with methods performed by the device.

The exemplary embodiments are described below with reference to the drawings. These drawings illustrate certain details of specific embodiments that implement the module, method, and computer program product described herein. However, the drawing should not be construed as imposing any limitations that may be present in the drawings. The methods and computer program product may be provided on any machine-readable media for accomplishing their operations. The embodiments may be implemented using an existing computer processor, or by a special purpose computer processor incorporated for this or another purpose, or by a hardwired system such as a field programmable gate array (FPGA), or by an application specific integrated circuit (ASIC).

Embodiments may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the internet and may use a wide variety of different communication protocols. Those skilled in the art will appreciate that such network computing environments will typically encompass many types of computer system configuration, including personal computers, hand-held devices, multiprocessor systems, microprocessor-based or programmable consumer electronics, network PCs, minicomputers, mainframe computers, and similar devices.

Embodiments may also be practiced in distributed computing environments where tasks are performed by local and remote processing devices that are linked by hardwired links, wireless links, or by a combination of hardwired or wireless links through a communication network. In a distributed computing environment, program modules may be located in both local and remote memory storage devices.

A system for implementing the disclosed embodiments might include a general-purpose computing device in the form of a computer, including a processing unit, a system memory, and a system bus, that couples various system components including the system memory to the processing unit. The system memory may include those known in the art, for instance read only memory (ROM) and random-access memory (RAM). Other elements may include a magnetic disk drive, an optical disk drive, or a flash memory drive, to name a few. The drives and their associated machine-readable media provide nonvolatile storage of machine-executable instructions, data structures, program modules and other data for the computer.

The device of the disclosure includes two analog-to-digital converters (ADCs). Each ADC is sampled by the same clock source, ensuring samples are synchronized. Each ADC is coupled to a signal received from a different antenna, for example a dish, or a different antenna element of a phased array antenna. The ADCs digitize an analog frequency division multiplex (FDM) signal received from its antenna, for example, an L-band signal. The ADCs sample at a sufficiently high rate so as not to introduce aliasing of the frequency band being digitized.

The device further includes a digital down converter (DDC) associated with each ADC that translates the received frequency band down to baseband. For example, the L-Band frequency range of 950 MHz to 1950 MHz is translated down to the band from −500 MHz to 500 MHz. The DDC outputs separate in-phase (I) and quadrature (Q) signal samples. A decimation filter follows the DDC to filter the I & Q output of the DDC to be within the frequency band of interest.

A digital phase meter accepts two I & Q pairs as inputs and outputs the quadrant of the phase difference between the pairs. The phase meter includes methods to adaptively adjust the gain of each I/Q pair, detect the phase difference between two I/Q pairs, filter the signal to an appropriate bandwidth for the frequency offset range, and validate that the quadrant does not drift due to poor signal-to-noise environments to increase measurement confidence. The output is received by a state machine which has a state for each quadrant of I/Q plane. For every decimated sampling clock period, the state machine registers the quadrant to which the phase meter output belongs.

For each quadrant, there is a quadrant counter. Each quadrant counter is incremented when the phase difference between the two input signals lies in that quadrant. In a noisy environment, the resolved quadrant will dither, resulting in multiple quadrant counters having a non-zero value. A quadrant select function sets a quadrant state based on which quadrant counter is the first counter to exceed a programmed confidence threshold, at which time it resets all quadrant counters.

A quadrant transition detector determines if there is a quadrant transition and whether the transition was in the clockwise or counterclockwise direction.

The state machine includes an up/down counter which is clocked at the decimated sample rate. The counter remains unchanged if adjacent phase samples fall into the same quadrant, increments whenever there is a clockwise change in quadrants between samples, and decrements whenever there is a counterclockwise change in quadrant. A single-clock-width pulse generator with a known period (for example, one second), registers the output of the up/down counter and resets its count to zero. The registered output represents an accumulation of the number of quadrants traversed in the period between pulses and the net direction of rotation, which indicates the sign of rotation. For example, if the pulse interval were one second, the counter outputs four times the frequency difference between the two antennas. This measure is used to adjust the DDC frequencies to correct the frequency offset.

Referring to FIG. 1, the present disclosure provides a mechanism for receiving radio frequency (RF) signals from two antenna sources 101, 102 in the form of a frequency division multiplex (FDM) consisting of multiple subcarriers, for example, signals received from the same satellite source.

The FDM is down-converted by a mixer contained within each antenna and input into separate radio frequency front ends (RFFEs) 201, 202 which filter their antenna outputs into an intermediate frequency band, for example, to L-band with a frequency range of 900 MHz to 2000 MHz.

The output of each RFFE is input to an analog-to-digital converter (ADC) 301, 302. The ADCs digitize their inputs and present them to digital down converters (DDCs) 401, 402 to create I & Q signal pairs for decimation filters 501, 502, 511, 512. The output of the decimation filters is provided to a frequency meter 701 that outputs the frequency difference between the outputs of 501, 511 and the outputs of 502, 512.

Figure 2:
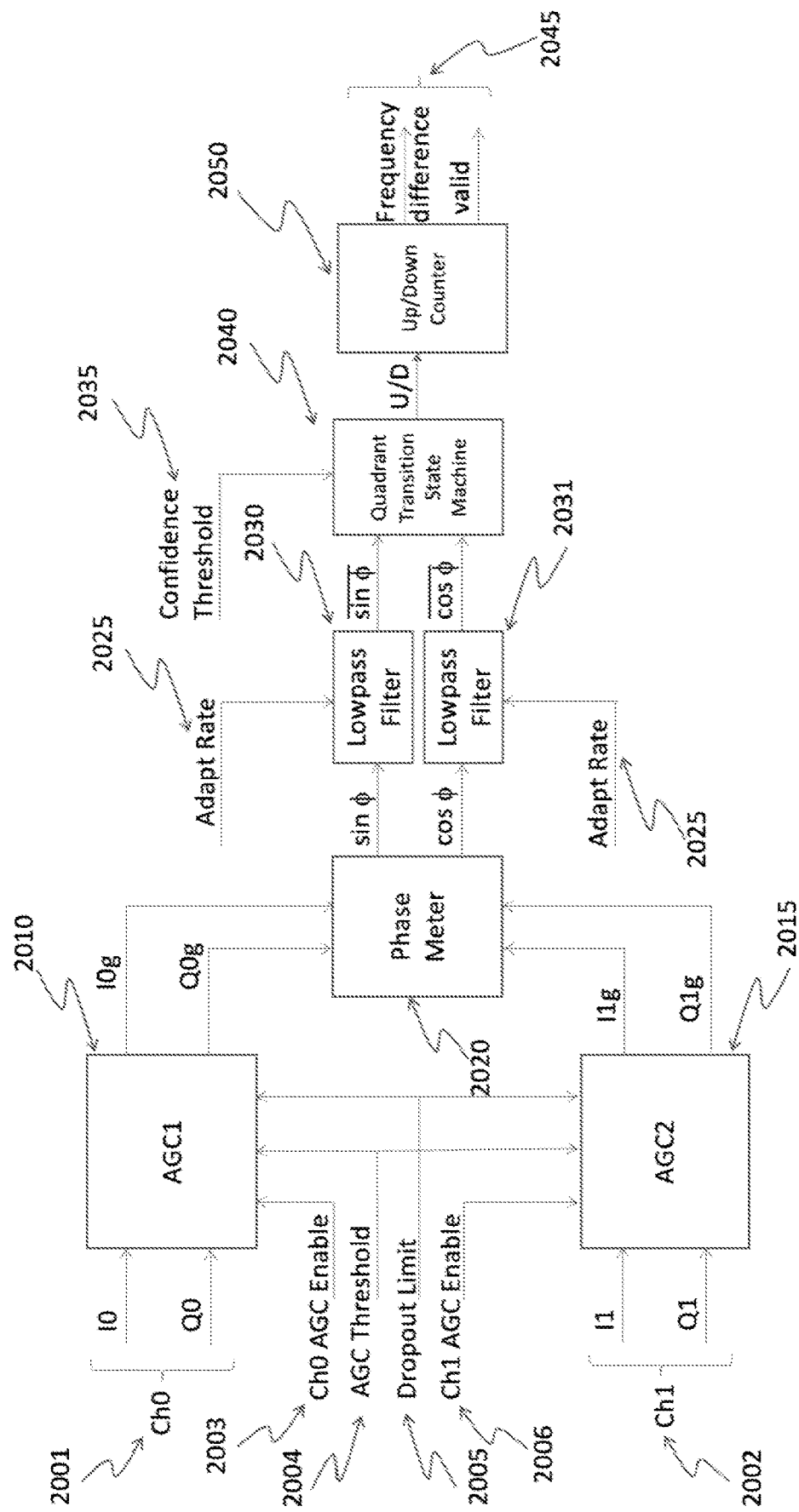
FIG. 2 is a schematic of one embodiment of a frequency meter, which outputs the filtered frequency difference between two complex input signals.

Referring to FIG. 2, a preferred embodiment of the frequency meter 701 is shown. The frequency meter receives complex baseband signals from two sources 2001, 2002 in the form of I/Q signal pairs. The two signal sources 2001, 2002 are input to automatic gain control (AGC) blocks. A first automatic gain control (AGC1) 2010 receives the Ch0 pair, and a second automatic gain control (AGC2) 2015 receives the Ch1 pair. If respective AGC Enable 2003, 2006 are active, they provide automatic gain control to their respective I0/Q0, I1/Q1 pairs. If they are not active, then the respective I/Q pairs are delayed replicas of the input pairs. Each of AGC1 2010 and AGC2 2015 have additional controlling inputs, an AGC threshold 2004 and a dropout limit 2005. The AGC threshold is the peak amplitude that causes an incremental decrease in gain, and the dropout limit controls the number of sample clocks that a signal may be below a fraction (e.g. ¼) of the AGC threshold before gain is incrementally increased.

A phase meter 2020, as depicted in FIG. 2, facilitates phase metering by providing an estimate of the phase displacement angle $\phi$ between complex vector $I0g+jQ0g$ and complex vector $I1g+jQ1g$, where $j$ is the square root of $-1$. Phase meter outputs are the $\sin \phi$ and $\cos \phi$ of the displacement angle $\phi$. Lowpass filters 2030 include an adapt rate parameter 2025 that controls the phase adaptation rate. This parameter is adjusted commensurate with the frequency offset range of the subcarriers from Ch0 2001 and Ch1 2002 that are to be measured. The lowpass filters 2030, 2031 provide an average of $\sin \phi$ and $\cos \phi$, to the quadrant transition state machine (QTSM) 2040. The QTSM output determines whether or not to increment or decrement an up/down counter which accumulates the number of quadrant transitions and their direction.

Figure 3:
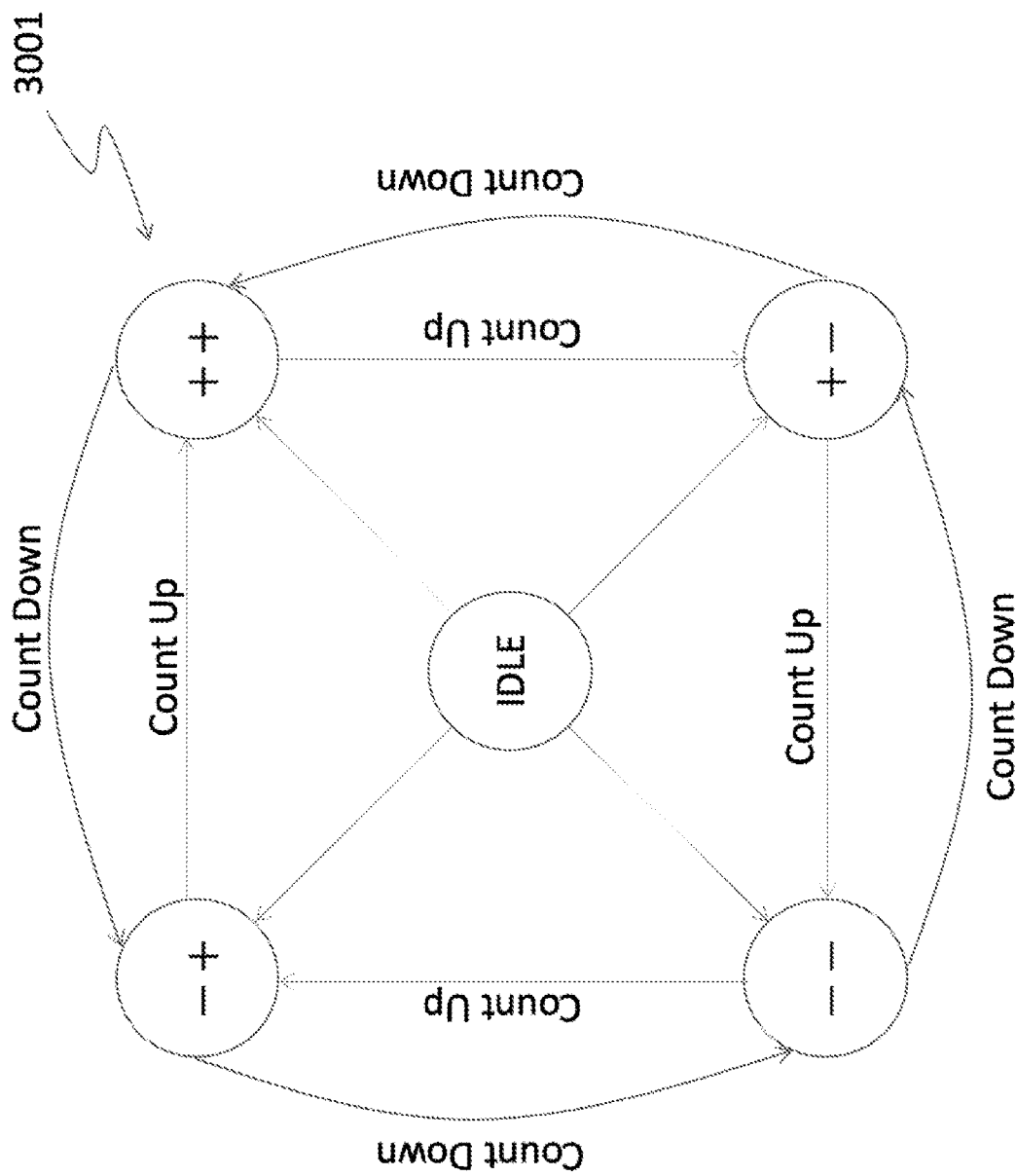
FIG. 3 is a state flow diagram of the quadrant transition state machine from FIG. 2 which is used to accumulate the number of quadrant transitions between the signals of the two signal paths.

FIG. 3 shows a state transition diagram 3001 of the state machine and indicates which quadrant transitions cause the up/down counter to increment or decrement. Based on quadrant state transitions, the QTSM determines whether to increment or decrement the up/down counter 2050. When the quadrant causes changes in a clockwise direction, the counter increments. When the quadrant causes changes in a counterclockwise direction, the counter decrements. And when the quadrant is maintained, or idle, the counter does not change.

Figure 4:
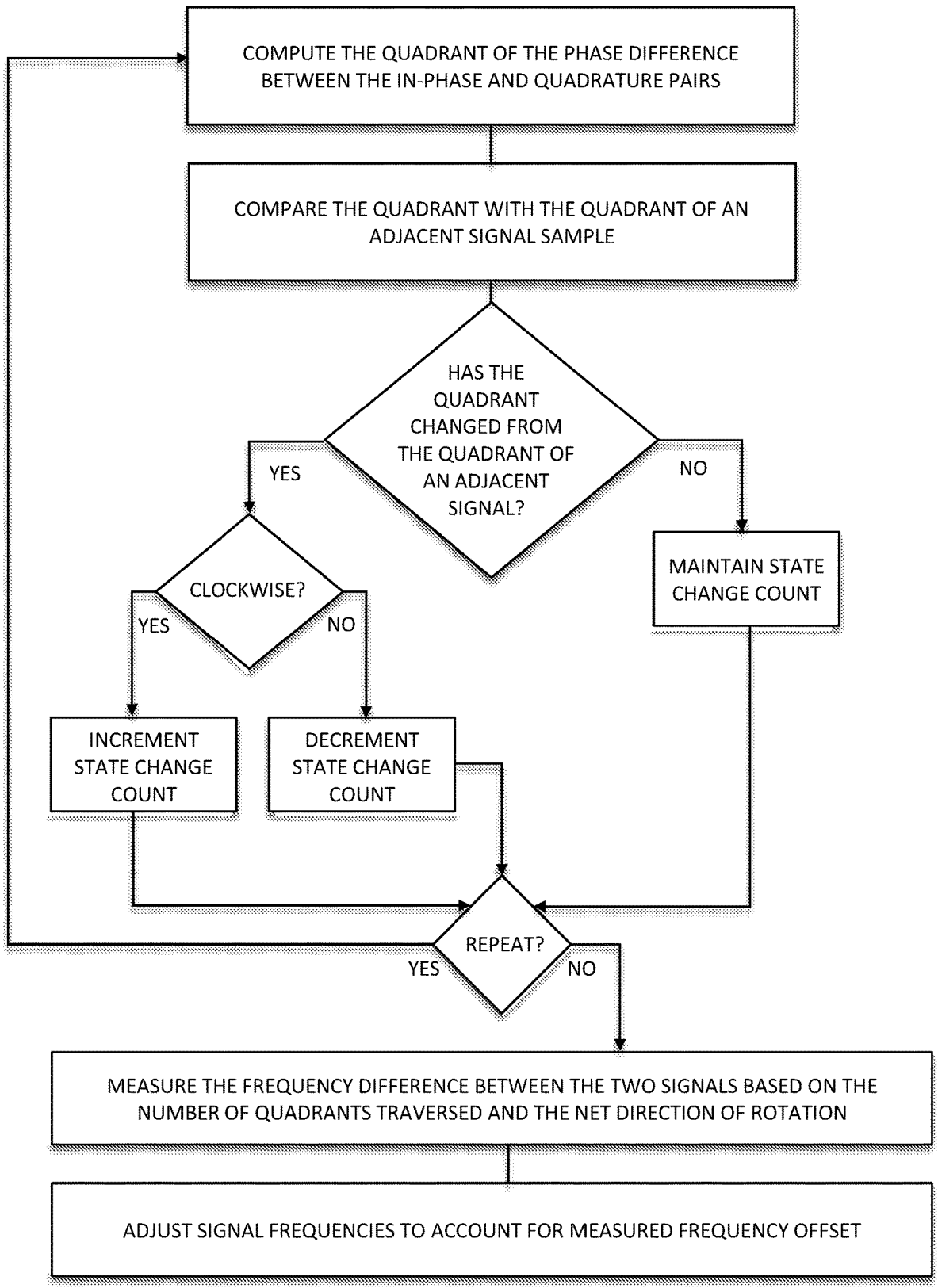
FIG. 4 is a flow chart of a method for measuring and adjusting a frequency offset of two signals.

FIG. 4 shows a flow diagram for a method according to the present disclosure. First, the quadrant of the phase difference between in-phase and quadrature pairs of a radio frequency signal from at least two antennas is determined, as described above with the phase meter 701 of FIG. 1. This is compared to the quadrant of in-phase and quadrature pairs of an adjacent sample. If the quadrant state has changed from one sample to another, a state change counter will be adjusted. The state change counter is incremented when adjacent samples result in a clockwise change in quadrants, is decremented when adjacent samples result in a counterclockwise change in quadrants, and is maintained when adjacent samples have the same quadrant. As noted above, the count is used to adjust the signal frequencies of the signal from the two antennas to account for a measured frequency offset and to enable improved coherent combining of the signals. The total count represents the number of quadrants traversed and the net direction of rotation over a sampling period.

Figure 5:
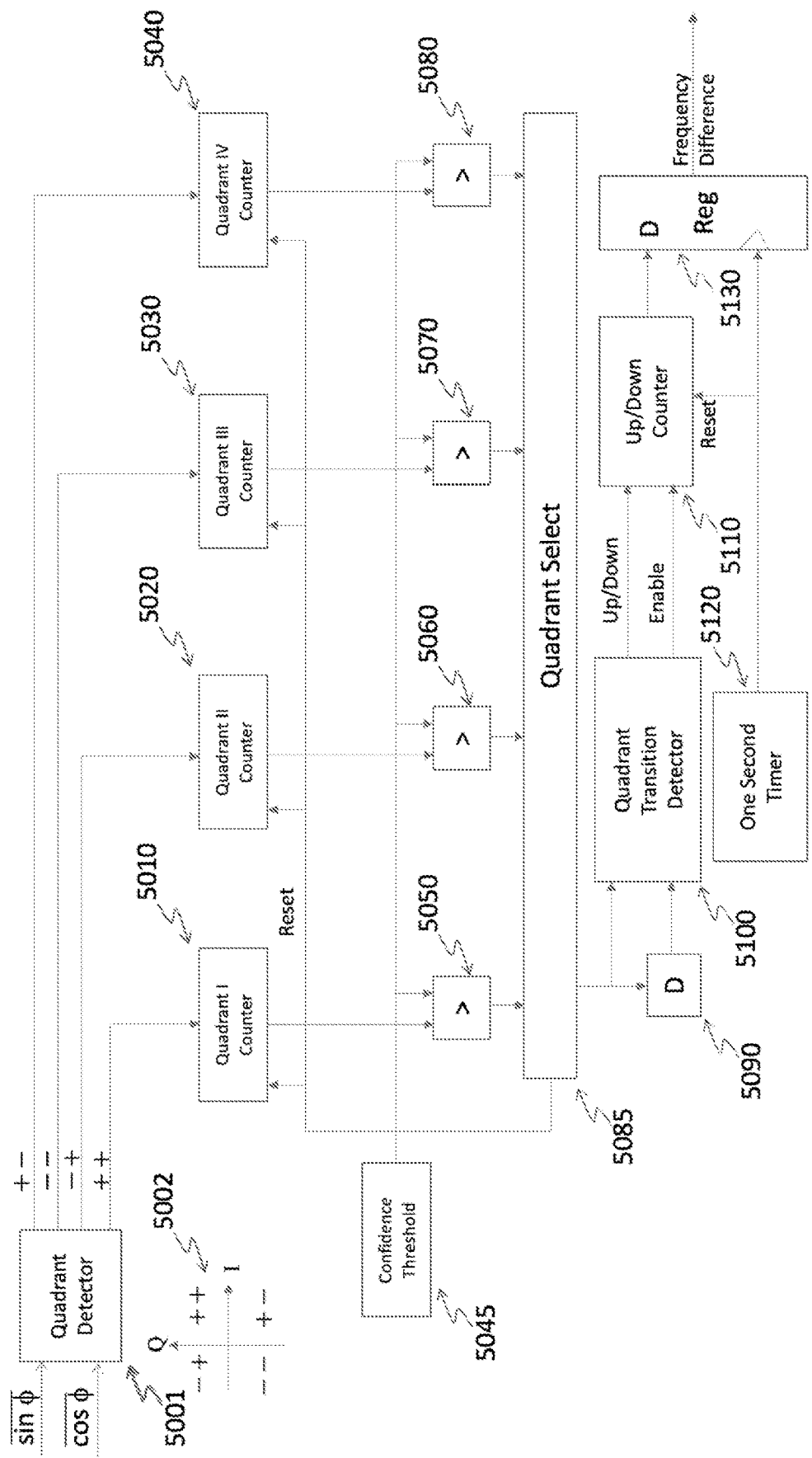
FIG. 5 is a schematic of one embodiment of a filtered frequency difference calculator.

FIG. 5 is a preferred embodiment of the previously described quadrant transition state machine (QTSM) 2040. The QTSM accepts filtered sine and cosine outputs from lowpass filters 2030, 2031 (FIG. 2), respectively. A quadrant detector 5001 determines which quadrant counter is incremented based on quadrant map 5002. Only one quadrant counter is incremented at a time, depending on the quadrant detected by the quadrant detector. When one of the quadrant counters 5010, 5020, 5030, 5040 exceeds a stored confidence threshold 5045, the quadrant select 5085 sets a new quadrant state, the previous quadrant state is stored in register 5090, all quadrant counters 5010, 5020, 5030, 5040 are reset, and a new quadrant count accumulation cycle is restarted. The current state of the quadrant select 5085 and the previous state recorded in register 5090 are input to a quadrant transition detector 5100, which determines whether to increment, decrement or hold the up/down counter 5110. A timer 5120, which in this case is a one-second timer, sends a pulse once per second to record the output of the up/down counter and reset it. The registered count after one second is 4 times the frequency difference between inputs 2001 and 2002. It will be understood by those with skill in the art that the time of the timer can vary.

To create in-phase and quadrature pairs, a frequency division multiplex signal is received and down-converted from two antenna sources with multiple subcarriers. The signal is filtered to an intermediate frequency band, digitized and down converted. The in-phase and quadrature pairs may also be decimated prior to measuring the phase difference between two pairs.

Although the above description with reference to particular embodiments, it is to be understood that these embodiments are merely illustrative of the principles and applications of the present disclosure. It is therefore to be understood that numerous modifications may be made to the illustrative embodiments and that other arrangements may be devised and employed without departing from the spirit and scope of the present disclosure.

What is claimed is:

1. A device for estimating the frequency difference between antennas having asynchronized local oscillator references, comprising a frequency meter configured for connection with radio frequency signals from two antennas and further configured to output a measured frequency difference between baseband filtered signals of two antennas, the frequency meter including:
   (a) a phase meter configured to receive in-phase and quadrature pairs of filtered signals and output a phase difference between the pairs;
   (b) a quadrant transition state machine configured to receive the phase difference, detect a quadrant associated with the phase difference, and detect a change between the detected quadrant and a previously detected quadrant; and
   (c) a frequency meter counter configured to accumulate the quadrant transitions and direction over a desired interval to establish a measure of the frequency difference between the two radio frequency signals input into phase meter.

2. The device of claim 1, wherein the quadrant transition state machine includes:
  i. a quadrant detector which detects a quadrant of the phase difference between two in-phase and quadrature pairs and increments a counter associated with the detected quadrant;
  ii. a plurality of quadrant counters configured to receive a signal from the quadrant detector to increment a quadrant count, wherein a quadrant counter is incremented when the phase difference lies within a quadrant associated with the quadrant counter;
  iii. a quadrant transition detector configured to detect one of a changed state and maintained state between a current quadrant state and a previous quadrant state; and
  iv. a quadrant transition counter which is decremented, incremented or maintained based on the detected changed state or maintained state of adjacent quadrants, wherein the quadrant transition counter is incremented when a quadrant change is clockwise, decremented when a quadrant change is counterclockwise, and maintained when there is no quadrant change.

3. The device of claim 2, wherein the quadrant transition state machine further includes:
  i. a confidence threshold detector configured to detect when one of the quadrant counters exceeds a confidence threshold, wherein when the threshold is exceeded the quadrant associated with that counter becomes the current quadrant state;
  ii. a quadrant select configured to set a new quadrant state when the confidence threshold is exceeded;
  iii. a register configured to store a previous quadrant state; and
  iv. an interval timer configured to periodically record the output of quadrant transition counter and reset the quadrant transition counter such that the recorded output of the quadrant transition counter is proportional to frequency.

4. The device of claim 2, and further comprising:
  (a) analog to digital converters configured to digitize a frequency band;
  (b) digital down converters connected with the analog to digital converters configured to translate a digitized frequency band to a baseband to create in-phase and quadrature pairs; and
  (c) decimation filters connected with the digital down converters and configured to filter a translated-to-baseband frequency band and output the filtered frequency band to the frequency meter.

5. The device of claim 4, and further comprising radio frequency front ends configured to receive a radio frequency signal and filter the signal to an intermediate frequency band which is output to the analog to digital converters.

6. The device of claim 1, the frequency meter further including low pass filters having an adapt rate parameter to control a phase adaptation rate.

7. A method for estimating the reference frequency difference between antennas having asynchronized local oscillator references, comprising the steps of:
  (a) determining the quadrant of the phase difference between in-phase and quadrature pairs of a plurality of radio frequency signal samples from at least two antennas;
  (b) determining whether a quadrant state has changed between at least two adjacent samples, wherein a state change is the result of adjacent samples having one of a clockwise and counterclockwise change in quadrant; and
  (c) measuring the frequency difference between the signal samples from at least two antennas, wherein measuring the frequency difference represents an accumulation of the number of quadrants traversed and the net direction of rotation that results over a sampling period.

8. The method of claim 7, wherein measuring the frequency difference between two signals includes incrementing, decrementing or maintaining a state change counter, wherein the state change counter is incremented when adjacent samples result in a clockwise change in quadrants, the state change counter is decremented when adjacent samples result in a counterclockwise change in quadrants, and the state change counter is maintained when adjacent samples have the same quadrant.

9. The method of claim 8, wherein determining the quadrant of the phase difference step follows the steps of:
  (a) receiving and digitizing two analog radio frequency signals; and
  (b) creating in-phase and quadrature pairs from the two digitized signals.

10. The method of claim 9, wherein receiving and digitizing two signals includes the steps of:
  (a) receiving down-converted frequency division multiplexed signals from two antenna sources with multiple subcarriers;
  (b) filtering the antenna outputs into an intermediate frequency band; and
  (c) digitizing the intermediate frequency band.

11. The method of claim 9, wherein the step of creating in-phase and quadrature pairs is followed by the step of reducing the sample rate of the in-phase and quadrature pairs.

12. The method of claim 7, following determining the quadrant step, further comprising the steps of:
  (a) accumulating the number of clock intervals for each quadrant to which a phase difference matches;
  (b) establishing a current quadrant state when the accumulated number of clock intervals for a quadrant exceeds a confidence interval.

13. The method of claim 7, and further comprising the step of adjusting the signal frequencies of the signal from at least two antennas to account for measured frequency offset.

* * * * *